(12) United States Patent
Shimotsusa

(10) Patent No.: US 9,231,019 B2
(45) Date of Patent: Jan. 5, 2016

(54) SOLID-STATE IMAGE SENSOR AND METHOD OF MANUFACTURING THE SAME

(71) Applicant: CANON KABUSHIKI KAISHA, Tokyo (JP)

(72) Inventor: Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 55 days.

(21) Appl. No.: 14/099,449

(22) Filed: Dec. 6, 2013

(65) Prior Publication Data

US 2014/0160335 A1      Jun. 12, 2014

(30) Foreign Application Priority Data

Dec. 10, 2012    (JP) .................................. 2012-269778

(51) Int. Cl.
*H01L 21/00* (2006.01)
*H01L 27/146* (2006.01)

(52) U.S. Cl.
CPC ...... *H01L 27/14698* (2013.01); *H01L 27/1463* (2013.01); *H01L 27/1464* (2013.01)

(58) Field of Classification Search
CPC .................. H01L 27/14627; H01L 27/14685; H01L 27/14621; H01L 31/0232; H01L 27/14623; H01L 21/26513; H01L 21/265; H01L 21/266; H01L 29/6659; H01J 37/3171
See application file for complete search history.

(56) References Cited

U.S. PATENT DOCUMENTS

| 6,762,473 | B1 | 7/2004 | Goushcha et al. ............ 257/443 |
| 7,576,371 | B1 | 8/2009 | Goushcha ..................... 257/184 |
| 7,935,557 | B2 | 5/2011 | Mishima et al. |
| 7,952,096 | B2 | 5/2011 | Rhodes ........................... 257/59 |
| 8,163,588 | B2 | 4/2012 | Mishima et al. |
| 8,274,122 | B2 | 9/2012 | Shimotsusa |
| 2010/0207231 | A1 | 8/2010 | Iwamoto et al. ............. 257/461 |
| 2011/0234868 | A1 | 9/2011 | Yamashita et al. |
| 2012/0181582 | A1 | 7/2012 | Mishima et al. |
| 2013/0222657 | A1 | 8/2013 | Shimotsusa |
| 2014/0347538 | A1* | 11/2014 | Toda ............................. 348/308 |

FOREIGN PATENT DOCUMENTS

| JP | A 2006-93587 | 4/2006 |
| JP | A 2009-111118 | 5/2009 |
| JP | A 2010-192483 | 9/2010 |

* cited by examiner

*Primary Examiner* — Michelle Mandala
(74) *Attorney, Agent, or Firm* — Fitzpatrick, Cella, Harper & Scinto

(57) ABSTRACT

A method of manufacturing a solid-state image sensor, includes forming a first isolation region of a first conductivity type in a semiconductor layer having first and second surfaces, the forming the first isolation region including first implantation for implanting ions into the semiconductor layer through the first surface, forming charge accumulation regions of a second conductivity type in the semiconductor layer, performing first annealing, forming an interconnection on a side of the first surface of the semiconductor layer after the first annealing, and forming a second isolation region of the first conductivity type in the semiconductor layer, the forming the second isolation region including second implantation for implanting ions into the semiconductor layer through the second surface. The first and second isolation regions are arranged between the adjacent charge accumulation regions.

8 Claims, 10 Drawing Sheets

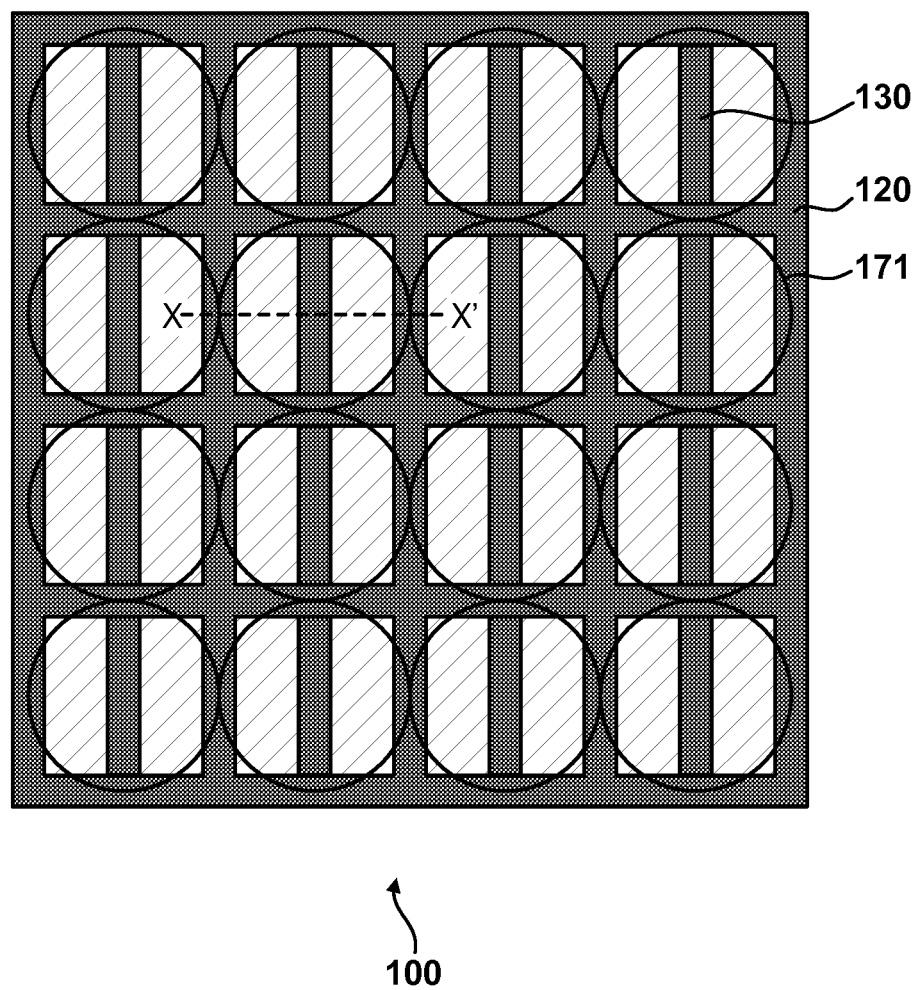

SOLID-STATE IMAGE SENSOR AND METHOD OF MANUFACTURING THE SAME

BACKGROUND OF THE INVENTION

1. Field of the Invention

The present invention relates to a solid-state image sensor and a method of manufacturing the same.

2. Description of the Related Art

Japanese Patent Laid-Open No. 2009-111118 relates to a solid-state image sensor, and describes a manufacturing method of reliably isolating signal charges between photoelectric conversion regions. The manufacturing method forms a first pixel isolation region by doping an impurity into a semiconductor substrate, forms a first epitaxial growth layer on the surface of the semiconductor substrate, and forms a second pixel isolation region to extend through the first epitaxial growth layer and contact the first pixel isolation region.

Japanese Patent Laid-Open No. 2006-93587 relates to a solid-state image sensor, and describes a method of manufacturing the solid-state image sensor, which prevents color mixing due to an increase in number of pixels per unit and suppresses generation of a dark current in an accumulation layer. The manufacturing method forms a photodiode in an n-type semiconductor layer arranged on an n-type semiconductor via a silicon oxide film, forms a p-type pixel isolation region to surround the photodiode, and forms a front-surface side $p^+$ accumulation layer. After that, the manufacturing method forms a back-surface side $p^+$ accumulation layer by implanting ions into the n-type semiconductor layer from its back surface side.

If an isolation region for isolating charge accumulation regions formed on a semiconductor layer from each other is formed by only ion implantation through one (to be referred to as an ion implantation surface hereinafter) of the two surfaces of the semiconductor layer, the width of the isolation region can be wider away from the ion implantation surface. This is because high implantation energy is required to implant ions into a region away from the ion implantation surface (that is, a deep region), thereby widening a region into which ions are implanted. This phenomenon in which the width of the isolation region becomes wider away from the ion implantation surface prevents the density of charge accumulation regions or pixels from increasing.

SUMMARY OF THE INVENTION

The present invention provides a manufacturing method advantageous in increasing the density of charge accumulation regions or pixels, and a solid-state image sensor having a structure advantageous in manufacturing by the manufacturing method.

One of aspects of the present invention provides a method of manufacturing a solid-state image sensor, comprising: forming a first isolation region of a first conductivity type in a semiconductor layer having a first surface and a second surface, the forming the first isolation region including first implantation for implanting ions into the semiconductor layer through the first surface; forming a plurality of charge accumulation regions of a second conductivity type different from the first conductivity type in the semiconductor layer; performing first annealing after the first implantation; forming an interconnection on a side of the first surface of the semiconductor layer after the first annealing; and forming a second isolation region of the first conductivity type in the semiconductor layer, the forming the second isolation region including second implantation for implanting ions into the semiconductor layer through the second surface, the second implantation being performed after the forming the interconnection, wherein the first isolation region and the second isolation region are arranged between two adjacent charge accumulation regions of the plurality of charge accumulation regions.

Further features of the present invention will become apparent from the following description of exemplary embodiments with reference to the attached drawings.

BRIEF DESCRIPTION OF THE DRAWINGS

FIG. 2 is a plan view schematically showing the arrangement of the solid-state image sensor according to the first or second embodiment;

DESCRIPTION OF THE EMBODIMENTS

Embodiments of the present invention will be described below with reference to the accompanying drawings.

Figure 1:
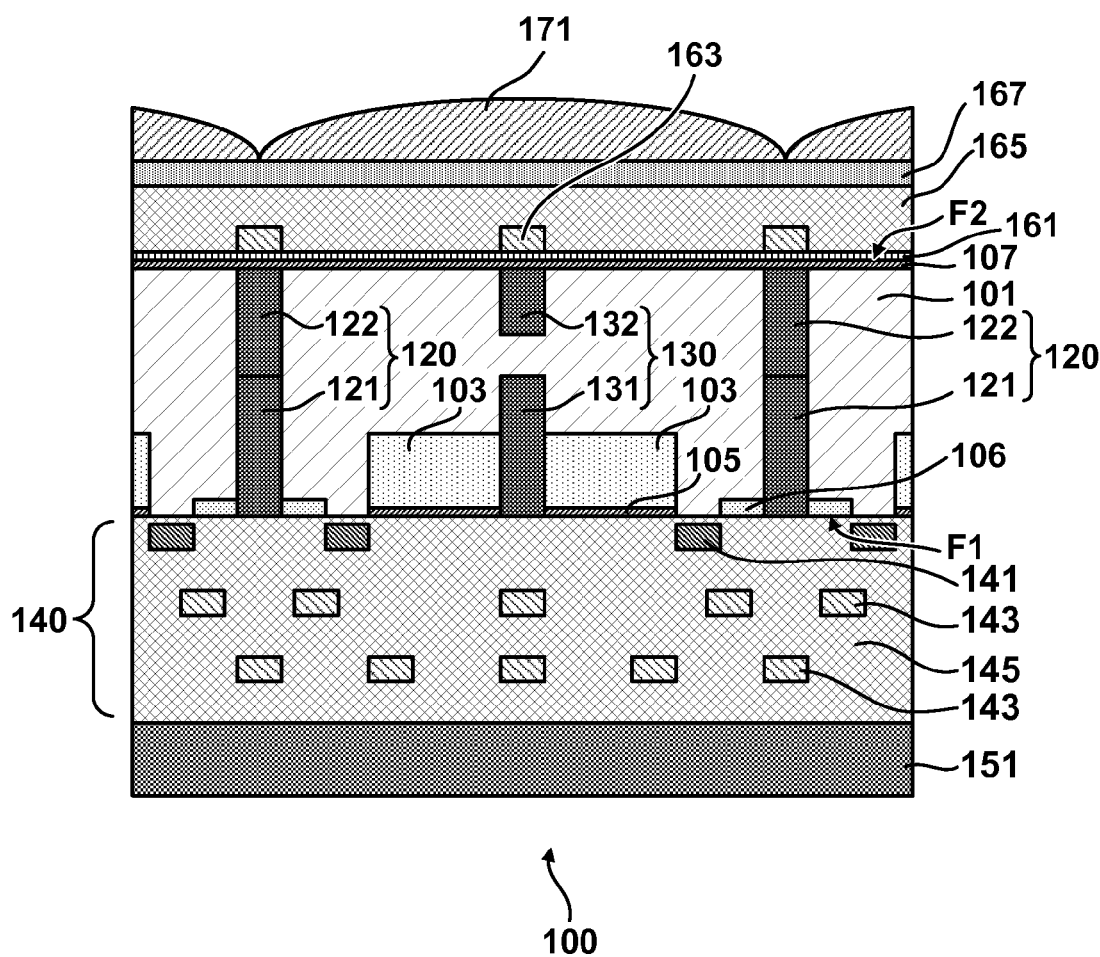
FIG. 1 is a sectional view schematically showing the arrangement of a solid-state image sensor according to the first or second embodiment.

FIG. 1 is a sectional view schematically showing the arrangement of a solid-state image sensor 100 according to the first embodiment of the present invention. FIG. 2 is a plan view schematically showing the arrangement of the solid-state image sensor 100 according to the first embodiment of the present invention. FIG. 1 is a sectional view taken along a line X-X' in FIG. 2.

The solid-state image sensor 100 includes a semiconductor layer 101 having a first surface F1 and a second surface F2, a plurality of charge accumulation regions 103 arranged in the semiconductor layer 101, and isolation regions 120 and 130 arranged in the semiconductor layer 101. The isolation regions 120 and 130 are arranged in the semiconductor layer 101 to isolate the plurality of charge accumulation regions 103 from each other. The isolation regions 120 and 130 are impurity semiconductor regions formed by ion implantation, and form potential barriers, respectively.

The solid-state image sensor 100 includes a plurality of microlenses 171. Note that the plurality of microlenses 171 are arrayed so that one microlens 171 is assigned to each charge accumulation region pair consisting of two charge accumulation regions 103. The solid-state image sensor 100 is configured to be able to individually read out signals corresponding to charges accumulated in each of the two charge accumulation regions 103 of the charge accumulation region pair. This arrangement can be used for focus detection by a phase-difference detection method. Furthermore, the solid-state image sensor 100 can be configured to be able to individually read out a signal corresponding to the sum of the charges accumulated in each of the two charge accumulation regions 103 of the charge accumulation region pair. The signal corresponding to the sum of the charges accumulated in each of the two charge accumulation regions 103 of the charge accumulation region pair corresponds to the signal of one pixel.

The isolation region 120 is an inter-pair isolation region which is arranged between the charge accumulation region pair and another charge accumulation region pair and forms a potential barrier. The isolation region 130 is an intra-pair isolation region which is arranged between the two charge accumulation regions 103 of the charge accumulation region pair and forms a potential barrier. The potential barrier formed by the intra-pair isolation region 130 is smaller than that formed by the inter-pair isolation region 120. This arrangement allows charges overflowing from one of the two charge accumulation regions 103 of one charge accumulation region pair to migrate to the other charge accumulation region, and is advantageous in preventing the migration of charges from the charge accumulation region pair to another charge accumulation region pair. This contributes to widening the dynamic range and reducing color mixing.

As a method of making the potential barrier formed by the intra-pair isolation region 130 smaller than that formed by the inter-pair isolation region 120, for example, there are the following first to third methods. Two or more of the first to third methods may be used in combination.

In the first method, the intra-pair isolation region 130 is formed by an impurity semiconductor region with a first number of steps, and the inter-pair isolation region 120 is formed by an impurity semiconductor region with a second number of steps, the first number being smaller than the second number.

In the second method, the impurity concentration of the intra-pair isolation region 130 is made lower than that of the inter-pair isolation region 120.

In the third method, the width of the intra-pair isolation region 130 in a direction along the first surface F1 is made smaller than that of the inter-pair isolation region 120 in the direction along the first surface F1.

The inter-pair isolation region 120 can include a first isolation region 121 and a second isolation region 122. The first isolation region 121 can be formed by implanting ions into the semiconductor layer 101 through the first surface F1. The second isolation region 122 can be formed by implanting ions into the semiconductor layer 101 through the second surface F2.

The intra-pair isolation region 130 can include a first isolation region 131 and a second isolation region 132. The first isolation region 131 can be formed by implanting ions into the semiconductor layer 101 through the first surface F1. The second isolation region 132 can be formed by implanting ions into the semiconductor layer 101 through the second surface F2. For example, the first isolation region 131 and the second isolation region 132 do not contact each other. The intra-pair isolation region 130 may be formed by an impurity semiconductor region with the first number of steps smaller than the second number of steps, thereby preventing the first isolation region 131 and the second isolation region 132 from contacting each other.

The solid-state image sensor 100 can include a front surface pinning layer 105 arranged between the first surface F1 and the charge accumulation regions 103. The solid-state image sensor 100 can also include a back surface pinning layer 107 arranged to be adjacent to the second surface F2. Note that the isolation regions 120 and 130, the front surface pinning layer 105, and the back surface pinning layer 107 are formed by impurity semiconductor regions of a first conductivity type. The semiconductor layer 101 and the charge accumulation regions 103 can be formed by impurity semiconductor regions of a second conductivity type different from the first conductivity type. If the first conductivity type is p-type, the second conductivity type is n-type, and vice versa.

The solid-state image sensor 100 can include floating diffusions 106 in the semiconductor layer 101. The floating diffusions 106 can be formed by impurity semiconductor regions of the second conductivity type. A transfer gate 141 can transfer charges accumulated in the charge accumulation region 103 to the floating diffusion 106 through a channel formed in the semiconductor layer 101. In addition, the solid-state image sensor 100 can include reset transistors for respectively resetting the potentials of the floating diffusions 106, and amplification transistors for respectively outputting signals corresponding to the charges transferred to the floating diffusions 106 to a vertical signal line.

The solid-state image sensor 100 can include a multiplayer wiring structure 140 on the side of the first surface F1. The multiplayer wiring structure 140 can include gate electrodes such as the transfer gates 141, wiring patterns 143, an insulating film 145, contact plugs (not shown), and via plugs (not shown). Moreover, the solid-state image sensor 100 can include an antireflection film 161, light-shielding films 163, an insulating film 165, and a color filter layer 167 on the side of the second surface F2. The solid-state image sensor in which the multiplayer wiring structure 140 is arranged on one side (the side of the first surface) of the semiconductor layer 101 and the microlenses 171 is arranged on the other side (the side of the second surface) of the semiconductor layer 101 can be called a back-side illumination solid-state image sensor. However, the present invention is not limited to this.

The solid-state image sensor 100 can include a support substrate 151 on the side of the multiplayer wiring structure 140. The support substrate 151 supports the multiplayer wiring structure 140, the semiconductor layer 101, and the like.

A method of manufacturing the solid-state image sensor 100 according to the first embodiment will be described below with reference to FIGS. 3A, 3B, 4A, 4B, 5A, 5B, 6A, 6B, and 1. In a process shown in FIG. 3A, a semiconductor substrate 101' such as a silicon substrate is prepared, element isolations such as a well and STI (Shallow Trench Isolation) are formed in the semiconductor substrate 101', and first isolation regions 121 and 131 are also formed. The semiconductor substrate 101' will become a semiconductor layer 101 later. The first isolation regions 121 and 131 can be formed by performing an ion implantation process for the semiconductor substrate 101' through its first surface F1 at least once (typically, a plurality of times). The first isolation regions 121 and 131 can be formed by impurity regions of the first conductivity type, as described above. If the first conductivity type is p-type, for example, the first isolation regions 121 and 131 can be formed by implanting boron into the semiconductor substrate 101' at 1.5 MeV, 1 MeV, 600 keV, 300 keV, 100 keV, and 50 keV. In some implementations, ions can be implanted into only the inter-pair isolation region 120 of the inter-pair isolation region 120 and the intra-pair isolation region 130 in some of a plurality of ion implantation processes.

Figure 3A:
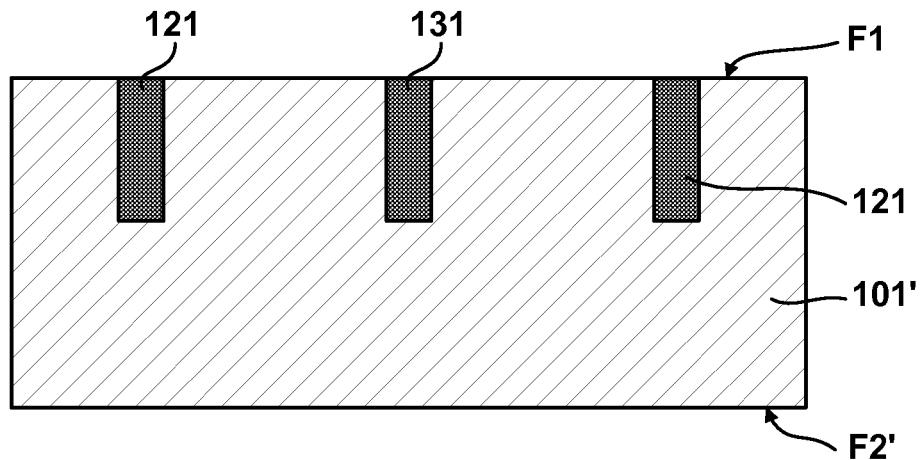
FIGS. 3A and 3B are views for explaining a method of manufacturing the solid-state image sensor according to the first embodiment.
Figure 3B:
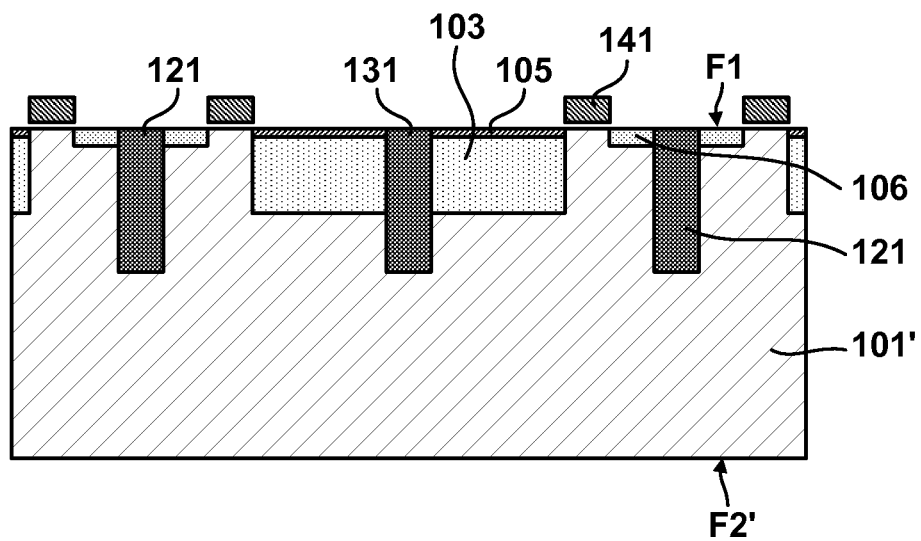

In a process shown in FIG. 3B, charge accumulation regions 103, a front surface pinning layer 105, floating diffusions 106, gate electrodes such as transfer gates 141, and a diffusion region of transistors are formed in the semiconductor substrate 101'. Note that the gate electrodes such as the transfer gates 141 are formed on the first surface F1 via a gate insulating film. As described above, the charge accumulation regions 103 and floating diffusions 106 are formed by impurity regions of the second conductivity type and the front surface pinning layer 105 is formed by an impurity region of the first conductivity type. If the first conductivity type is p-type, for example, the front surface pinning layer 105 can be formed by implanting boron into the semiconductor substrate 101' at 10 keV.

After performing the ion implantation processes for forming the impurity semiconductor regions such as the first isolation regions 121 and 131, a first annealing process for recovering crystal defects due to the ion implantation can be performed. The first annealing process can be performed by, for example, an FA (Furnace Annealing) method using an electric furnace or an RTP (Rapid Thermal Annealing) method.

Figure 4A:
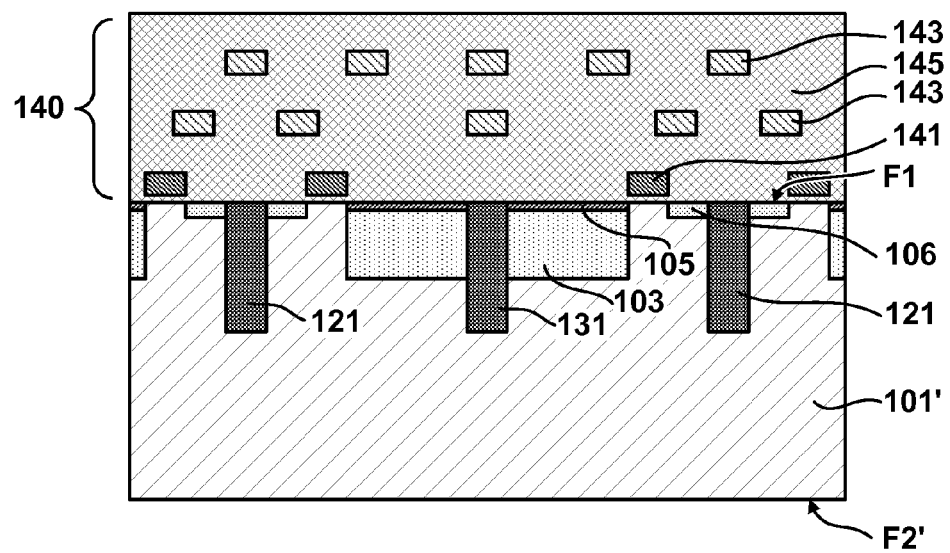
FIGS. 4A and 4B are views for explaining the method of manufacturing the solid-state image sensor according to the first embodiment.

In a process shown in FIG. 4A which is performed after the first annealing process, a multiplayer wiring structure 140 is formed on the first surface F1 of the semiconductor substrate 101'.

Figure 4B:
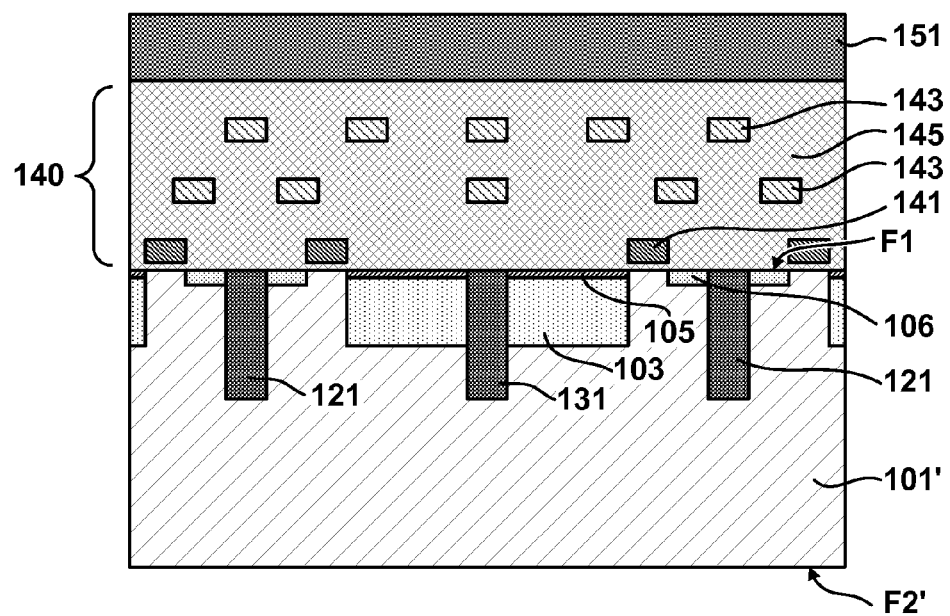

A process shown in FIG. 4B is an optional process in which a support substrate 151 is bonded to the multiplayer wiring structure 140. On the surface of the multiplayer wiring structure 140, a planarized insulating film is typically exposed. The support substrate 151 is a substrate such as a silicon substrate or glass substrate, and typically has a planarized surface. The support substrate 151 can be bonded to the multiplayer wiring structure 140 in, for example, a vacuum or inert gas atmosphere. It is possible to increase the bonding strength by irradiating the surface of the multiplayer wiring structure 140 and the surface of the support substrate 151 with a plasma before the bonding process. Alternatively, before the bonding process, the surface of the multiplayer wiring structure 140 and the surface of the support substrate 151 may be activated by a chemical treatment.

Although the surface of the support substrate 151 is directly bonded to the surface of the multiplayer wiring structure 140 in the above bonding process, an adhesive material may be used for bonding. Benzocyclobutene, for example, can be used as the adhesive material, and allows bonding at about 250° C.

Figure 5A:
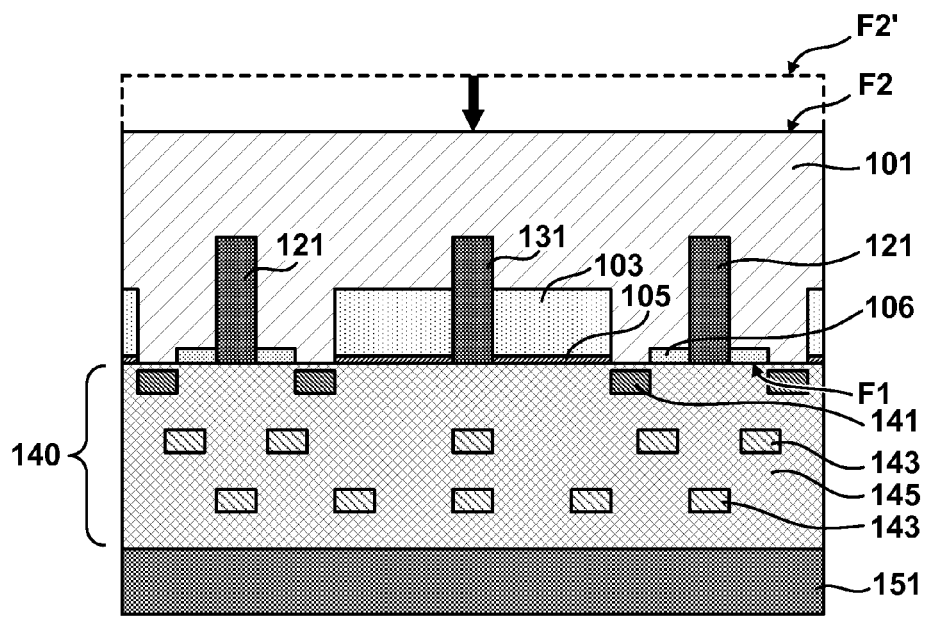
FIGS. 5A and 5B are views for explaining the method of manufacturing the solid-state image sensor according to the first embodiment.

In a process shown in FIG. 5A, the semiconductor substrate 101' is thinned by processing the side of a second surface F2' of the semiconductor substrate 101', thereby forming a semiconductor layer 101 having a processed second surface F2. The semiconductor substrate 101' can be thinned by, for example, grinding, polishing, CMP (Chemical Mechanical Polishing), or etching. If the semiconductor layer 101 is a silicon layer, it preferably has a thickness of, for example, 2 to 10 μm. In this case, the semiconductor layer 101 absorbs 80% or more of light of a wavelength range of 400 to 700 nm which includes the wavelength range of visible light and wavelengths in its neighborhood.

Figure 5B:
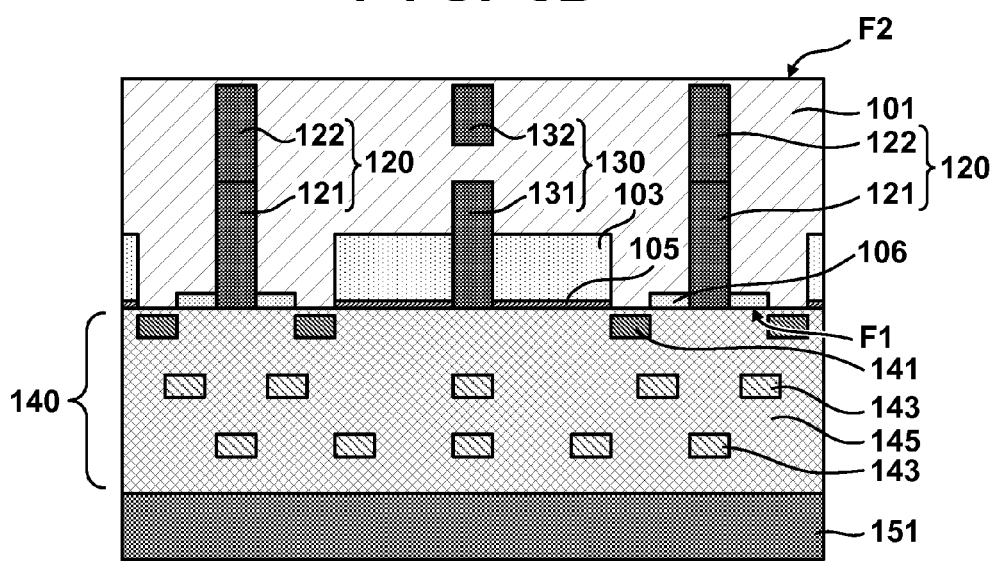

In a process shown in FIG. 5B, second isolation regions 122 and 132 are formed. The process shown in FIG. 5B is performed after the process shown in FIG. 4A. The second isolation regions 122 and 132 can be formed by performing an ion implantation process for the semiconductor layer 101 through its second surface F2 at least once (typically, a plurality of times). As described above, the second isolation regions 122 and 132 can be formed by impurity regions of the first conductivity type. If the first conductivity type is p-type, for example, the second isolation regions 122 and 132 can be formed by implanting boron into the semiconductor layer 101 at 600 keV, 300 keV, 100 keV, and 50 keV. This can form an inter-pair isolation region 120 including the first isolation region 121 and the second isolation region 122, and an intra-pair isolation region 130 including the first isolation region 131 and the second isolation region 132. In some implementations, ions can be implanted into only the inter-pair isolation region 120 of the inter-pair isolation region 120 and the intra-pair isolation region 130 in some of a plurality of ion implantation processes.

The number of times of ion implantation for forming the second isolation region 122 is preferably smaller than that for forming the first isolation region 121. Alternatively, the dimension of the second isolation region 122 in the depth direction is preferably smaller than that of the first isolation region 121 in the depth direction. Furthermore, the number of times of ion implantation for forming the second isolation region 132 is preferably smaller than that for forming the first isolation region 131. Or, the dimension of the second isolation region 132 in the depth direction is preferably smaller than that of the first isolation region 131 in the depth direction. This is because heat is preferably, selectively applied near the second surface F2 in a second annealing process for recovering crystal defects due to ion implantation for forming the second isolation regions 122 and 132 and a back surface pinning layer 107 (to be described below).

Figure 6A:
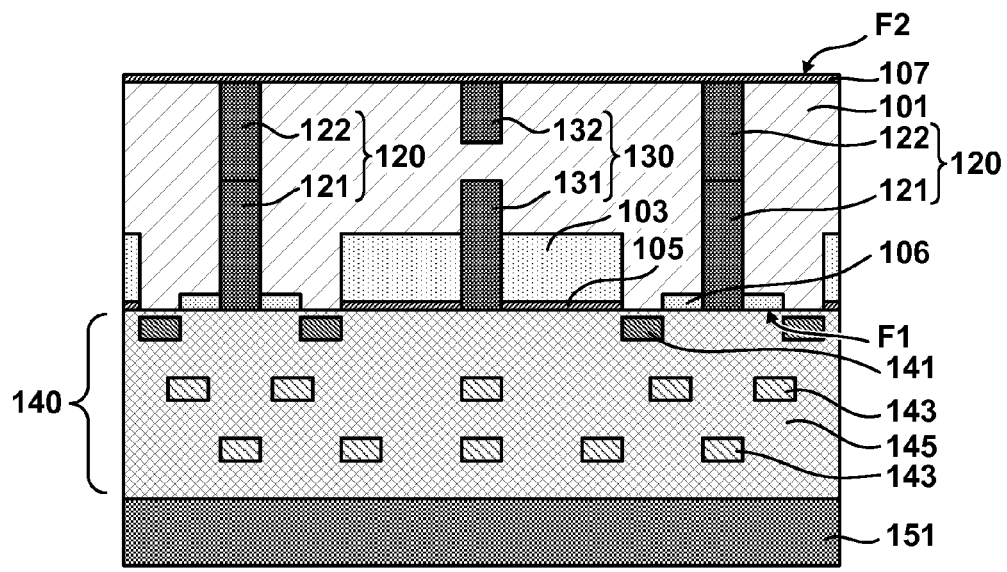
FIGS. 6A and 6B are views for explaining the method of manufacturing the solid-state image sensor according to the first embodiment.

In a process shown in FIG. 6A, the back surface pinning layer 107 is formed by implanting ions near the second surface F2. If the first conductivity type is p-type, for example, the back surface pinning layer 107 can be formed by implanting boron into the semiconductor layer 101 through the second surface F2 at 10 keV. After that, the second annealing process for recovering crystal defects due to the ion implantation for forming the second isolation regions 122 and 132 and the back surface pinning layer 107 is performed. In the second annealing process, a method different from that used in the first annealing process can be used. At this time, since the multiplayer wiring structure 140 has already been formed on the side of the first surface F1, heat is selectively applied near the second surface F2 in the second annealing process so as to prevent the temperature of the wiring patterns 143 from reaching the melting point.

The second annealing process can be performed by, for example, a method of irradiating the second surface F2 with light. More specifically, the second annealing process can be performed by, for example, a laser annealing method or flash lamp annealing method. If the laser annealing method is applied, the second surface F2 is irradiated with a laser beam using a 308-nm (XeCl) excimer laser for about 100 nsec.

The second annealing process may be performed after forming an antireflection film 161 and before forming light-shielding films 163 (to be described later). In this case, ion implantation for forming the back surface pinning layer 107 may be performed after forming the antireflection film 161 (and before performing the second annealing process). If ion implantation for forming the back surface pinning layer 107 is performed after forming the antireflection film 161, the antireflection film 161 can function as a buffer layer for preventing channeling in ion implantation.

Figure 6B:
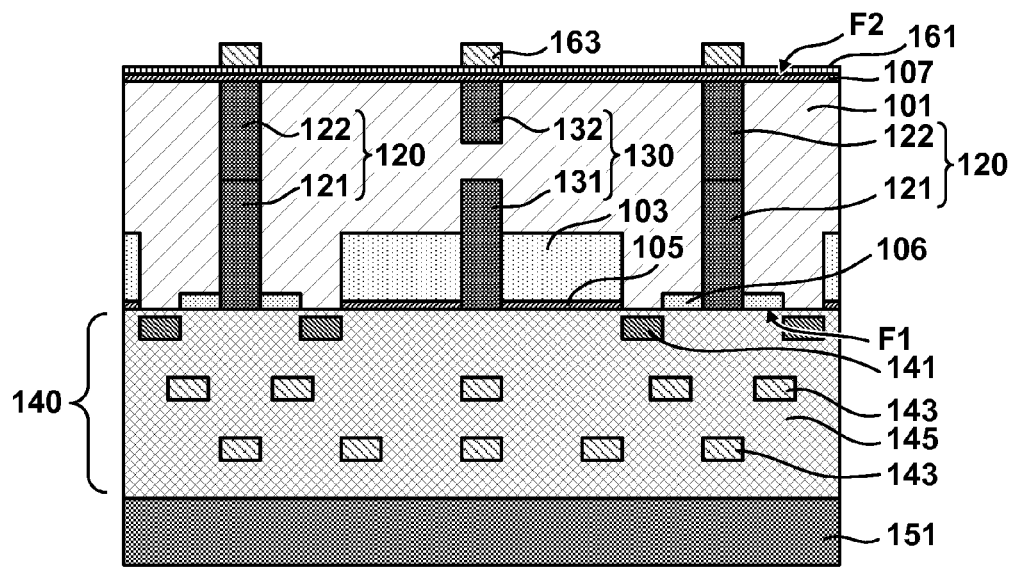

In a process shown in FIG. 6B, the antireflection film 161 is formed on the second surface F2 of the semiconductor layer 101. The antireflection film 161 can be formed by, for example, a silicon oxide film and a silicon nitride film. The antireflection film 161 can have, for example, a stacked structure including a silicon oxide film having a thickness of 5 nm and a silicon nitride film having a thickness of 50 nm or a stacked structure including a silicon oxide film having a thickness of 5 nm, a silicon nitride film having a thickness of 50 nm, and a silicon oxide film having a thickness of 50 nm. Note that the antireflection film 161 is not limited to them, and can adopt any structure having an antireflection function.

In the process shown in FIG. 6B, the light-shielding films 163 are formed on the antireflection film 161. The light-shielding films 163 can be made of, for example, aluminum or tungsten. Note that the light-shielding films 163 are optional components.

A description will be provided with reference to FIG. 1. In a process shown in FIG. 1, an insulating film (planarized film) 165 is formed on the light-shielding films 163 and the antireflection film 161, a color filter layer 167 is formed on the insulating film 165, and then microlenses 171 are formed on the color filter layer 167.

A manufacturing method according to the second embodiment of the present invention will be described below with reference to FIGS. 7A, 7B, 8A, 8B, and 9. A method of obtaining a thinned semiconductor layer 101 in the second embodiment is different from that in the first embodiment. Details not mentioned in the second embodiment conform to the first embodiment unless a mismatch occurs.

Figure 7A:
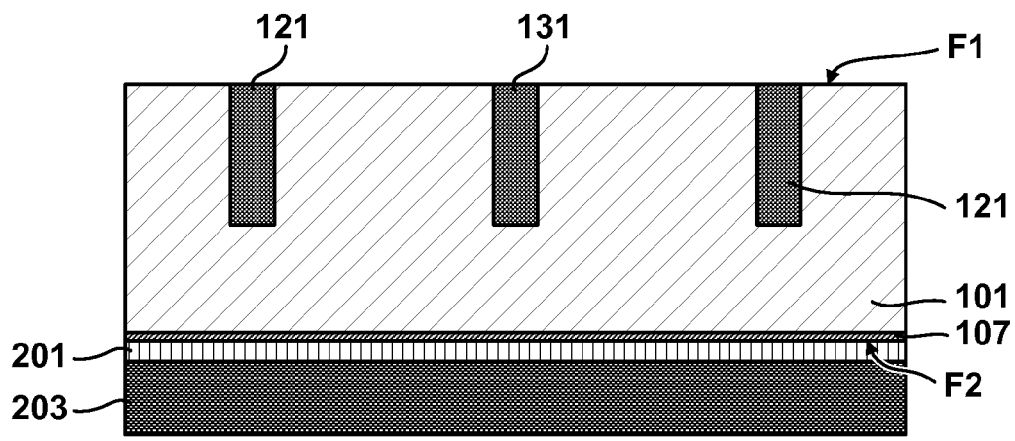
FIGS. 7A and 7B are views for explaining a method of manufacturing the solid-state image sensor according to the second embodiment.

In a process shown in FIG. 7A, an SOI (Silicon On Insulator) substrate is prepared. The SOI substrate includes a buried insulating layer 201 on a handle substrate 203, and includes a semiconductor layer 101 on the buried insulating layer 201. In the process shown in FIG. 7A, a back surface pinning layer 107 is formed in the semiconductor layer 101 by implanting ions into the semiconductor layer 101 through its first surface F1. For example, the back surface pinning layer 107 can be formed to contact the buried insulating layer 201. Note that when manufacturing an SOI substrate, a back surface pinning layer 107 may be formed in a semiconductor layer 101. Furthermore, in the process shown in FIG. 7A, element isolations such as a well and STI (Shallow Trench Isolation) are formed in the semiconductor layer 101, and first isolation regions 121 and 131 are formed. After performing an ion implantation process for forming impurity semiconductor regions such as the first isolation regions 121 and 131, a first annealing process for recovering crystal defects due to the ion implantation can be performed. The first annealing process can be performed by, for example, an FA (Furnace Annealing) method using an electric furnace or an RTP (Rapid Thermal Annealing) method.

Figure 7B:
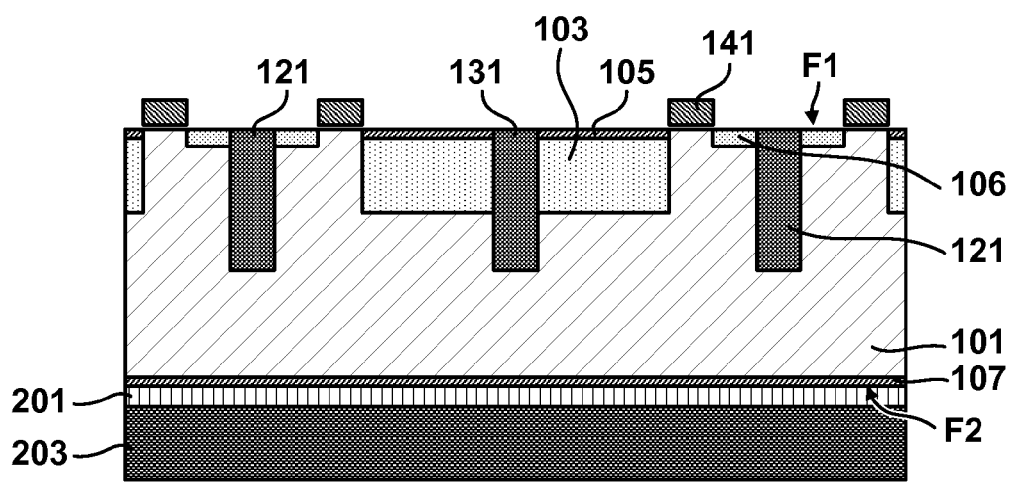

In a process shown in FIG. 7B, charge accumulation regions 103, a front surface pinning layer 105, floating diffusions 106, gate electrodes such as transfer gates 141, a diffusion region of transistors, and the like are formed in the semiconductor layer 101.

Figure 8A:
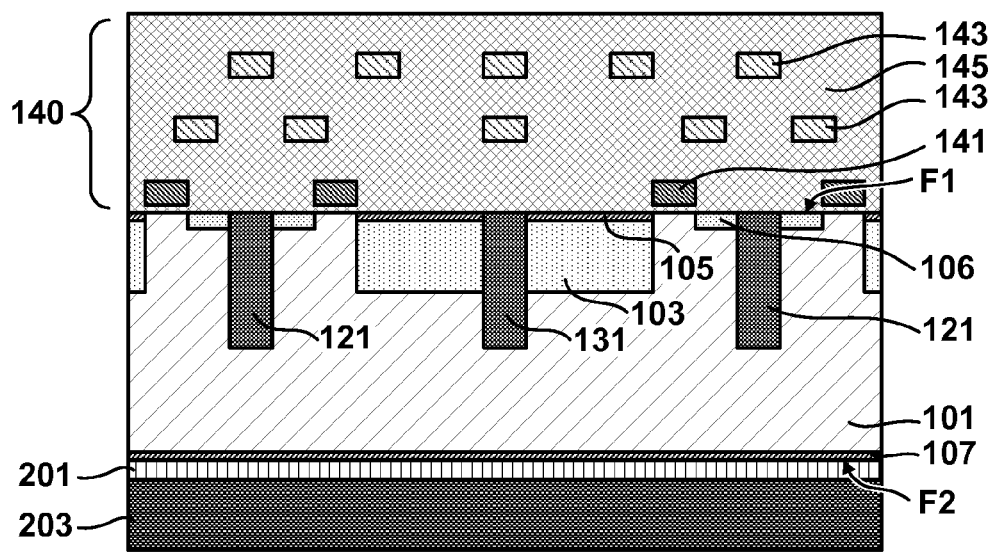
FIGS. 8A and 8B are views for explaining the method of manufacturing the solid-state image sensor according to the second embodiment.
Figure 8B:
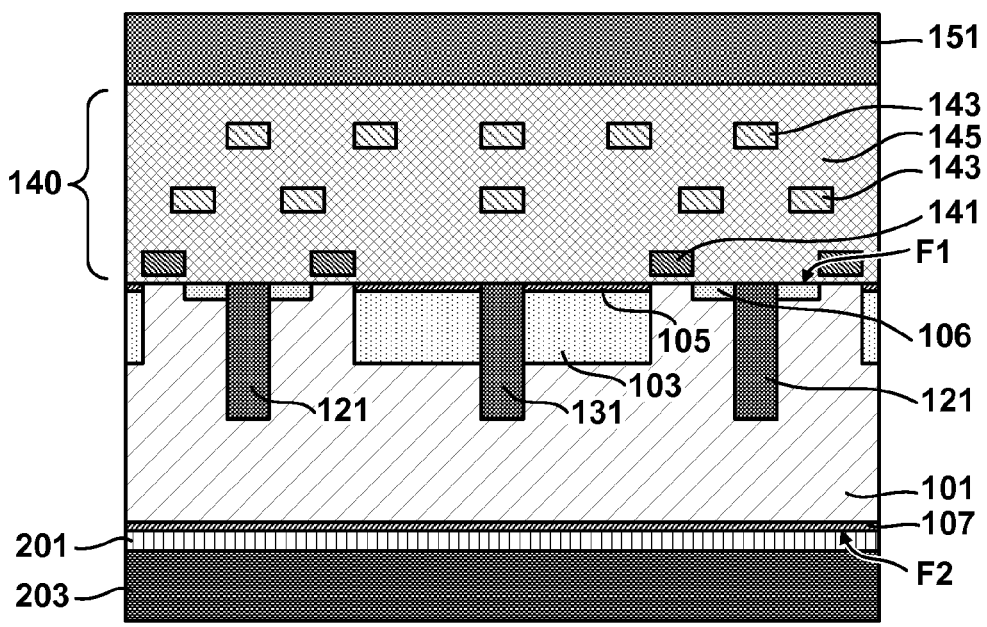

In a process shown in FIG. 8A, a multiplayer wiring structure 140 is formed on the first surface F1 of the semiconductor layer 101. The process shown in FIG. 8A is performed after the first annealing process. A process shown in FIG. 8B is an optional process in which a support substrate 151 is bonded to the multiplayer wiring structure 140.

Figure 9:
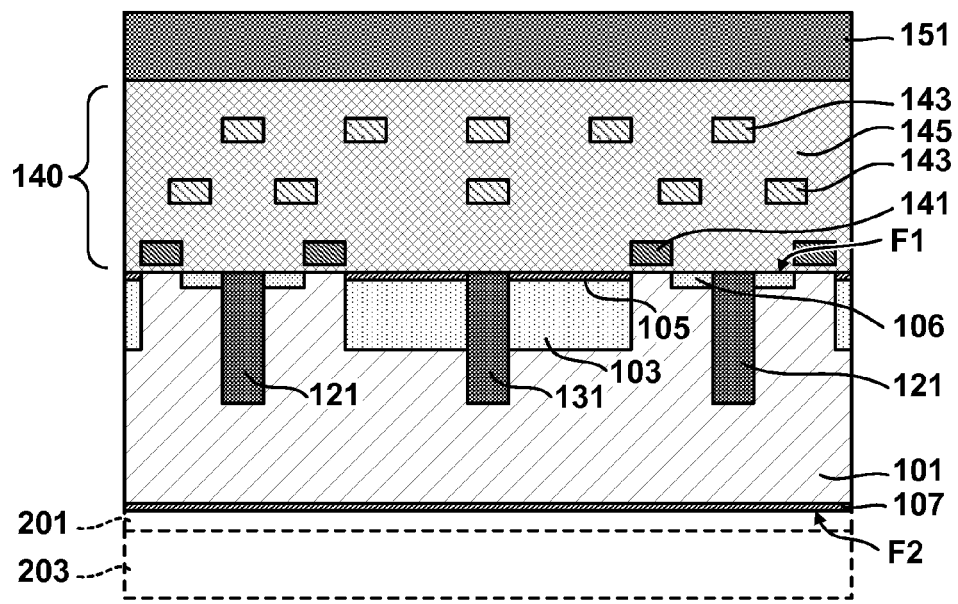
FIG. 9 is a view for explaining the method of manufacturing the solid-state image sensor according to the second embodiment.

In a process shown in FIG. 9, the handle substrate 203 and the buried insulating layer 201 are removed (that is, the SOI substrate is thinned to leave the semiconductor layer 101). This process corresponds to the thinning process shown in FIG. 5A in the first embodiment. The handle substrate 203 and the buried insulating layer 201 can be removed by, for example, etching the handle substrate 203 using the buried insulating layer 201 as an etching stop layer, and then etching the buried insulating layer 201. Note that if the buried insulating layer 201 has a structure usable as an antireflection film 161, a process of removing the buried insulating layer 201 and a process of forming an antireflection film 161 can be omitted.

The subsequent processes are the same as those shown in FIGS. 5B, 6A, 6B, and 1 in the first embodiment.

Figure 10:
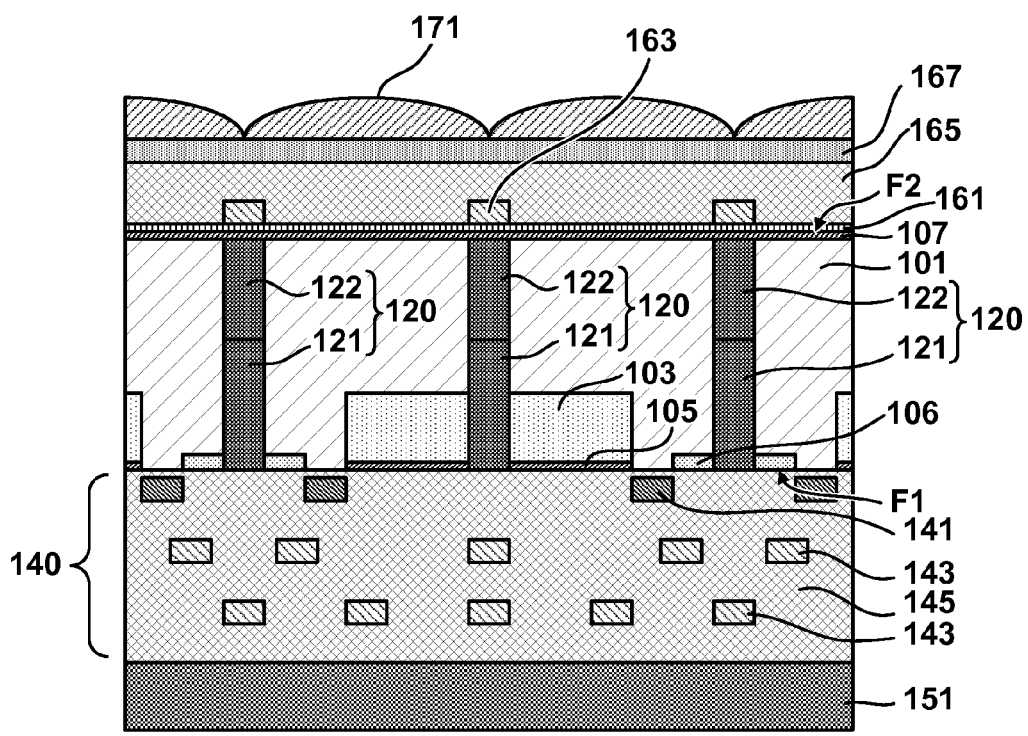
FIG. 10 is a view for explaining a solid-state image sensor and a method of manufacturing the solid-state image sensor according to the third embodiment.

The third embodiment of the present invention will be described below with reference to FIG. 10. Details not mentioned in the third embodiment conform to the first or second embodiment unless a mismatch occurs. In the first and second embodiments, one microlens 171 is assigned to each charge accumulation region pair including two charge accumulation regions 103. In the third embodiment, one microlens 171 is assigned to each charge accumulation region 103. An isolation region 120 is arranged between charge accumulation regions 103, thereby forming a potential barrier. The isolation region 120 can include a first isolation region 121 and a second isolation region 122. The first isolation region 121 can be formed by implanting ions into a semiconductor layer 101 through its first surface F1. The second isolation region 122 can be formed by implanting ions into the semiconductor layer 101 through its second surface F2.

The number of times of ion implantation for forming the second isolation region 122 is preferably smaller than that for forming the first isolation region 121. Alternatively, the dimension of the second isolation region 122 in the depth direction is preferably smaller than that of the first isolation region 121 in the depth direction.

A solid-state image sensor and a method of manufacturing the solid-state image sensor according to the third embodiment are the same as those in the first embodiment except that the isolation regions 120 are arranged instead of the isolation regions 130 in the first embodiment and one microlens 171 is assigned to each charge accumulation region 103.

Figure 11:
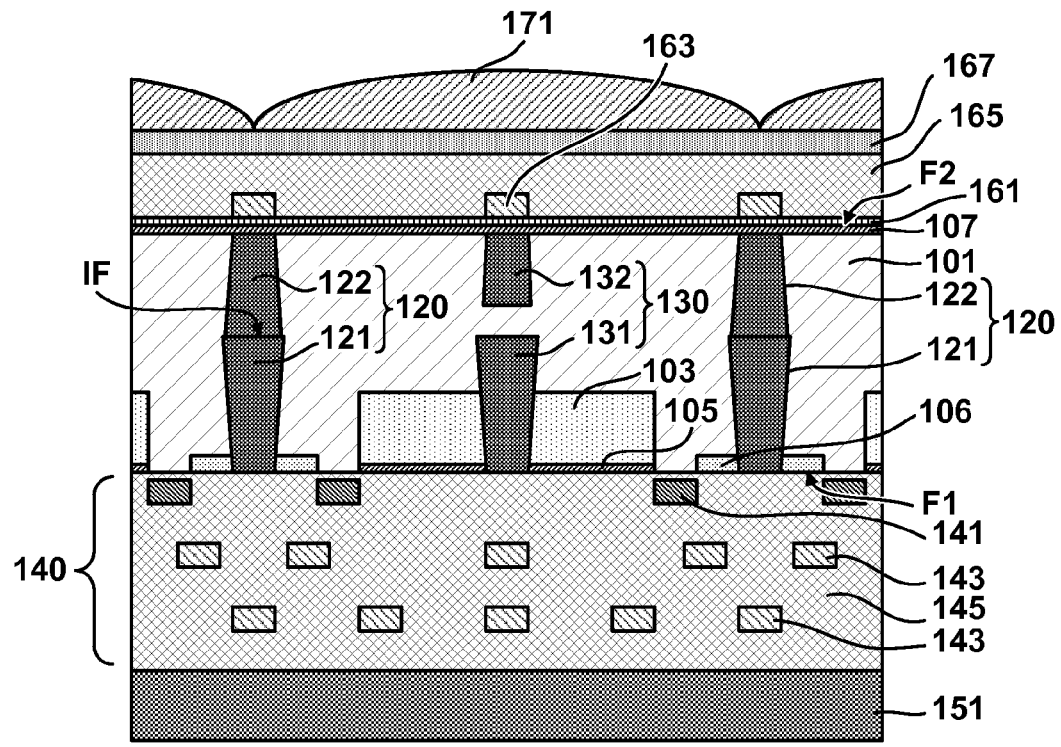
FIG. 11 is a view for explaining a solid-state image sensor and a method of manufacturing the solid-state image sensor according to the fourth embodiment.

The fourth embodiment of the present invention will be described below with reference to FIG. 11. Details not mentioned in the fourth embodiment conform to the first or second embodiment unless a mismatch occurs.

In the fourth embodiment, a plurality of microlenses 171 are arrayed so that one microlens 171 is assigned to each charge accumulation region pair including two charge accumulation regions 103. In the fourth embodiment, a first isolation region 120 includes a first isolation region 121 and a second isolation region 122 which are interconnected by a connection surface IF. The first isolation region 121 is arranged between a first surface F1 and the connection surface IF to contact the connection surface IF. The second isolation region 122 is arranged between a second surface F2 and the connection surface IF to contact the connection surface IF. The width of the first isolation region 121 is larger on the side of the connection surface IF than on the side of the first surface F1 and/or the width of the second isolation region 122 is larger on the side of the connection surface IF than on the side of the second surface F2. This can reduce the possibility that the first isolation region 121 and the second isolation region 122 are separated from each other due to an alignment error in a lithography process.

The above-described structure of the first isolation region 121 can be realized by performing ion implantation into the semiconductor layer 101 through the first surface F1 a plurality of times. That is, high ion implantation energy is required to implant ions into a position away from the first surface F1 (a deep position), thereby widening, in the lateral direction (a direction parallel to the first surface F1), a region into which ions are implanted. For example, ion implantation can be performed a plurality of times at different energy levels using masks having the same opening. Similarly, the above-described structure of the second isolation region 122 can be realized by performing ion implantation into the semiconductor layer 101 through the second surface F2 a plurality of times.

Figure 12:
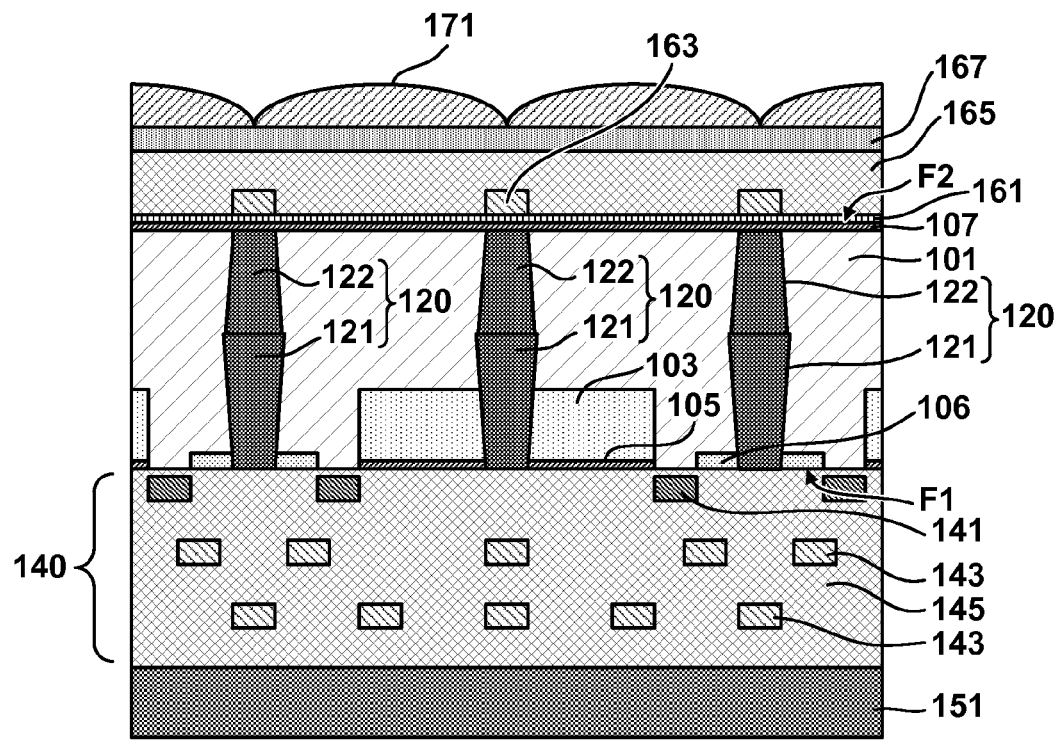
FIG. 12 is a view for explaining a solid-state image sensor and a method of manufacturing the solid-state image sensor according to the fifth embodiment.

FIG. 12 illustrates the fifth embodiment of the present invention. The fifth embodiment is the same as the fourth embodiment except that isolation regions 120 are arranged instead of the isolation regions 130 in the fourth embodiment, and one microlens 171 is assigned to each charge accumulation region 103.

As an application of the slid-state image sensor according to each of the above embodiments, a camera incorporating the solid-state image sensor will be exemplified. The camera conceptually includes not only a device whose principal purpose is photographing but also a device (for example, a personal computer or portable terminal) additionally provided with a photographing function. The camera includes the solid-state image sensor according to the present invention, which has been exemplified in the above embodiments, and a processing unit for processing a signal output from the solid-state image sensor. The processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-269778, filed Dec. 10, 2012, which is hereby incorporated by reference herein in its entirety.

What is claimed is:

1. A method of manufacturing a solid-state image sensor, comprising:
    forming a first isolation region of a first conductivity type in a semiconductor layer having a first surface and a second surface, the forming the first isolation region including first implantation for implanting ions into the semiconductor layer through the first surface;
    forming a plurality of charge accumulation regions of a second conductivity type different from the first conductivity type in the semiconductor layer;
    performing first annealing after the first implantation;
    forming an interconnection on a side of the first surface of the semiconductor layer after the first annealing; and
    forming a second isolation region of the first conductivity type in the semiconductor layer, the forming the second isolation region including second implantation for implanting ions into the semiconductor layer from a side opposite to a side of the first surface, the second implantation being performed after the forming the interconnection,
    wherein the first isolation region and the second isolation region are arranged between two adjacent charge accumulation regions of the plurality of charge accumulation regions.

2. The method according to claim 1, wherein
the forming the first isolation region and the forming the plurality of charge accumulation regions are performed for a substrate including a region to be the semiconductor layer, and
the forming the second isolation region is performed after thinning the substrate having undergone the forming the first isolation region and the forming the plurality of charge accumulation regions.

3. The method according to claim 1, further comprising performing second annealing after the forming the second isolation region.

4. The method according to claim 3, wherein
the first annealing is performed by a furnace annealing method or an rapid thermal annealing method, and
the second annealing is performed by a laser annealing method or a flash lamp annealing method.

5. The method according to claim 1, wherein
the number of times of ion implantation for forming the second isolation region in the forming the second isolation region is smaller than the number of times of ion implantation for forming the first isolation region in the forming the first isolation region.

6. The method according to claim 1, wherein
highest ion implantation energy used in the forming the first isolation region is higher than highest ion implantation energy used in the forming the second isolation region.

7. The method according to claim 1, wherein
a dimension of the first isolation region in a depth direction of the semiconductor layer is larger than a dimension of the second isolation region in the depth direction.

8. The method according to claim 1, further comprising forming a plurality of microlenses above the side of the semiconductor layer which is opposite to the side of the first surface of the semiconductor layer,
wherein the plurality of microlenses are arranged so that one of the plurality of microlenses is assigned to each charge accumulation region pair including two charge accumulation regions, and
a potential barrier formed by the first isolation region and the second isolation region which are arranged between the two charge accumulation regions of the charge accumulation region pair is lower than a potential barrier formed by the first isolation region and the second isolation region which are arranged between the charge accumulation region pair and another charge accumulation region pair.

* * * * *